(12) United States Patent
Yu et al.

(10) Patent No.: US 6,501,121 B1
(45) Date of Patent: Dec. 31, 2002

(54) SEMICONDUCTOR STRUCTURE

(75) Inventors: Zhiyi Yu, Gilbert, AZ (US); Jamal Ramdani, Chandler, AZ (US); Ravindranath Droopad, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/712,875

(22) Filed: Nov. 15, 2000

(51) Int. Cl.$^7$ ................................................ H01L 29/76
(52) U.S. Cl. ........................................ 257/310; 438/785
(58) Field of Search ............................... 257/412, 410, 257/382, 383, 310; 438/785

(56) References Cited

U.S. PATENT DOCUMENTS

| | | |
|---|---|---|
| 4,289,920 A | 9/1981 | Hovel |
| 4,459,325 A | 7/1984 | Nozawa et al. |
| 4,482,422 A | 11/1984 | McGinn et al. |
| 4,748,485 A | 5/1988 | Vasudev |
| 4,773,063 A | 9/1988 | Hunsperger et al. |
| 4,841,775 A | 6/1989 | Ikeda et al. |
| 4,901,133 A | 2/1990 | Curran et al. |
| 4,984,043 A | 1/1991 | Vinal |
| 5,051,790 A | 9/1991 | Hammer |
| 5,055,445 A | 10/1991 | Belt et al. |
| 5,067,809 A | 11/1991 | Tsubota |
| 5,073,981 A | 12/1991 | Giles et al. |
| 5,140,651 A | 8/1992 | Soref et al. |
| 5,081,519 A | 11/1992 | Nishimura et al. |
| 5,185,589 A | 2/1993 | Krishnaswamy et al. |
| 5,227,196 A | 7/1993 | Itoh |
| 5,262,348 A | 11/1993 | Pribat et al. |
| 5,266,355 A | 11/1993 | Wernberg et al. |
| 5,273,929 A | 12/1993 | Hirtz et al. |
| 5,281,834 A | 1/1994 | Cambou et al. |
| 5,352,926 A | 10/1994 | Andrews |
| 5,356,509 A | 10/1994 | Terranova et al. |

(List continued on next page.)

FOREIGN PATENT DOCUMENTS

| | | |
|---|---|---|
| DE | 197 12 496 | 10/1997 |
| EP | 0 581 239 | 2/1994 |
| EP | 0 682 266 | 11/1995 |
| EP | 0 964 259 | 12/1999 |
| EP | 1 109 212 | 6/2001 |
| JP | 60-210018 | 10/1985 |
| JP | 64-52329 | 2/1989 |
| JP | 0812494 | 1/1996 |
| JP | 10-256154 | 9/1998 |
| JP | 10-303396 | 11/1998 |
| JP | 2 000 1645 | 6/2000 |
| WO | WO 94/03908 | 2/1994 |
| WO | WO 98/05807 | 1/1998 |

OTHER PUBLICATIONS

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Myung Bok Lee; "Formation and Characterization of Eptiaxial $TiO_2$ and $BaTiO_3/TiO_2$ Films on Si Substrate"; Japan Journal Applied Physics Letters; vol. 34; 1995; pp. 808–811.

(List continued on next page.)

*Primary Examiner*—Hoai Ho
*Assistant Examiner*—Thao P Le
(74) *Attorney, Agent, or Firm*—Oblon, Spivak, McClelland, Maier & Neustadt, P.C.

(57) ABSTRACT

A structure and method for forming a high dielectric constant device structure includes a monocrystalline semiconductor substrate and an insulating layer formed of an epitaxially grown oxide such as $(A)_y(Ti_xM_{1-x})_{1-y}O_3$, wherein A is an alkaline earth metal or a combination of alkaline earth metals and M is a metallic or semi-metallic element. Semiconductor devices formed in accordance with the present invention exhibit low leakage current density.

22 Claims, 1 Drawing Sheet

U.S. PATENT DOCUMENTS

| | | | |
|---|---|---|---|
| 5,356,510 A | 10/1994 | Pribat et al. | |
| 5,360,754 A | 11/1994 | Pribat et al. | |
| 5,441,577 A | 8/1995 | Sasaki et al. | |
| 5,473,047 A | 12/1995 | Shi | |
| 5,486,406 A | 1/1996 | Shi | |
| 5,504,035 A | 4/1996 | Rostoker et al. | |
| 5,504,183 A | 4/1996 | Shi | |
| 5,511,238 A | 4/1996 | Bayraktaroglu | |
| 5,514,904 A | 5/1996 | Onga et al. | |
| 5,528,057 A | 6/1996 | Yanagase et al. | |
| 5,538,941 A | 7/1996 | Findikoglu et al. | |
| 5,541,422 A | 7/1996 | Wolf et al. | |
| 5,549,977 A | 8/1996 | Jin et al. | |
| 5,552,547 A | 9/1996 | Shi | |
| 5,553,089 A | 9/1996 | Seki et al. | |
| 5,572,052 A | 11/1996 | Kashihara et al. | |
| 5,596,205 A | 1/1997 | Reedy et al. | |
| 5,610,744 A | 3/1997 | Ho et al. | |
| 5,659,180 A | 8/1997 | Shen et al. | |
| 5,670,800 A | 9/1997 | Nakao et al. | |
| 5,689,123 A | 11/1997 | Major et al. | |
| 5,754,319 A | 5/1998 | Van De Voorde et al. | |
| 5,789,845 A | 8/1998 | Wadaka et al. | |
| 5,801,072 A | 9/1998 | Barber | |
| 5,833,603 A | 11/1998 | Kovacs et al. | |
| 5,840,456 A | 11/1998 | Tomita et al. | |
| 5,863,326 A | 1/1999 | Nause et al. | |
| 5,872,493 A | 2/1999 | Ella | |
| 5,873,977 A | 2/1999 | Desu et al. | |
| 5,883,564 A | 3/1999 | Partin | |
| 5,907,792 A | 5/1999 | Droopad et al. | |
| 5,937,274 A | 8/1999 | Kondow et al. | |
| 5,987,011 A | 11/1999 | Toh | |
| 6,011,646 A | 1/2000 | Mirkarimi et al. | |
| 6,022,140 A | 2/2000 | Fraden et al. | |
| 6,023,082 A | 2/2000 | McKee et al. | |
| 6,046,464 A | 4/2000 | Schetzina | |
| 6,049,702 A | 4/2000 | Tham et al. | |
| 6,051,849 A | 4/2000 | Davis et al. | |
| 6,108,125 A | 8/2000 | Yano | |
| 6,150,239 A | 11/2000 | Goesele et al. | |
| 6,153,010 A | 11/2000 | Kiyoku et al. | |
| 4,242,595 A | 12/2000 | Lehovec | |
| 6,175,497 B1 | 1/2001 | Tseng et al. | |
| 6,175,555 B1 | 1/2001 | Hoole | |
| 6,183,926 B1 | 2/2001 | Kuroda et al. | |
| 6,184,044 B1 * | 2/2001 | Sone et al. | 438/3 |
| 6,204,737 B1 | 3/2001 | Ella | |
| 6,211,096 B1 * | 4/2001 | Allman et al. | 438/785 |
| 6,229,159 B1 | 5/2001 | Suzuki | |
| 6,235,649 B1 * | 5/2001 | Kawahara et al. | 438/785 |
| 6,241,821 B1 | 6/2001 | Yu et al. | |
| 6,242,686 B1 | 6/2001 | Kishimoto et al. | |
| 6,248,459 B1 | 6/2001 | Wang et al. | |
| 6,252,261 B1 | 6/2001 | Usui et al. | |
| 6,255,198 B1 | 7/2001 | Linthicum et al. | |
| 6,258,502 B1 | 7/2001 | Nakamura et al. | |
| 6,268,269 B1 | 7/2001 | Lee et al. | |
| 6,277,436 B1 | 8/2001 | Stauf et al. | |
| 6,291,319 B1 | 9/2001 | Yu et al. | |
| 6,303,257 B1 | 10/2001 | Hasegawa et al. | |
| 6,313,486 B1 | 11/2001 | Kencke et al. | |
| 6,316,785 B1 | 11/2001 | Nunoue et al. | |
| 6,362,017 B1 | 3/2002 | Manabe et al. | |
| 2001/0013313 A1 | 8/2001 | Droopad et al. | |

OTHER PUBLICATIONS

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1999) R169–R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143–14146.

T. Kanniainen et al.; "Growth of Dielectric 1hfo2/Ta2O5 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Stephen A. Mass; "Microwave Mixers"; Second Edition; 2pp.

Douglas J. Hamilton et al.; "Basic Integrated Circuit Engineering"; pp.2; 1975.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of $ZnO/SiO_2/Si$ Monolithic Integrated Programmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fuel Resources to Heat Stabilizers; A Wiley–Interscience Publication; John Wiley & Sons.

John W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP–bonded–to Si Substrate"; Fourth International Conference on Indium Phosphide and Related Materials, Newport, RI, USA; Apr. 21–24, 1992; pp. 167–170; XP000341253; IEEE, New York, NY, USA; ISBN: 0–7803–0522–1.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321–326.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A.Y Wu et al.; "Highly Oriented (Pb,La)(Zr,Ti)$O_3$ Thin Films on Amorphous Substrates"; IEEE, 1992; pp. 301–304.

Q-Y. Tong et al.; "IOS—a new type of materials combination for system–on–a chip preparation"; 1999 IEEE International SOI Conference, Oct. 1999; pp104–105.

K. Eisenbeiser et al.; "Field effect transistors with SrTiO3 gate dielectric on Si"; Applied Physics Letters; vol. 76, No. 10, Mar. 6, 2000; pp. 1324–1326.

A.J. Moulson et al; "Electroceramics Materials Properties Applications"; Chapman & Hall; pp. 367–369.

R.A. McKee et al; "Crystalline Oxides on Silicon: The First Five Monolayers"; Physical Review Letters; vol. 81, No. 14; Oct. 5, 1998; pp. 3014–3017.

T.A. Langdo et al.; "High Quality Ge on Si by Epitaxial Necking"; Applied Physics Letters; vol. 76, No. 25; Jun. 19, 2000; pp. 3700–3702.

O.J. Painter et al.; "Room Temperature Photonic Crystal Defect Lasers at Near–Infrared Wavelengths in InGaAsP"; Journal of Lightwave Technology; vol. 17, No. 11, Nov. 1999; pp. 2082–2088.

* cited by examiner

SEMICONDUCTOR STRUCTURE

FIELD OF THE INVENTION

This invention relates generally to semiconductor structures and devices and to a method for their fabrication, and more specifically to semiconductor structures and devices and to the fabrication and use of semiconductor structures, devices, and integrated circuits that include an epitaxially grown, high dielectric constant oxide to reduce leakage current density.

BACKGROUND OF THE INVENTION

Epitaxial growth of single crystal oxide thin films on silicon is of great interest in numerous device applications, such as, for example, ferroelectric devices, non-volatile high density memory devices and next-generation MOS devices. Also, in the preparation of these films, it is pivotal to establish an ordered transition layer or buffer layer on the silicon surface for the subsequent growth of the single crystal oxides, such as, for example, perovskites.

Some of these oxides, such as BaO and $BaTiO_3$ were formed on silicon (100) using a $BaSi_2$ (cubic) template by depositing one fourth monolayer of Ba on silicon (100) using molecular beam epitaxy at temperatures greater than 850° C. See, e.g., R. McKee et al., *Appl. Phys. Lett.* 59(7), p. 782–784 (Aug. 12, 1991); R. McKee et al., *Appl. Phys. Lett.* 63(20), p. 2818–2820 (Nov. 15, 1993); R. McKee et al.,*Mat. Res. Soc. Symp. Proc.*, Vol. 21, p. 131–135 (1991); U.S. Pat. No. 5,225,031, issued Jul. 6, 1993, entitled "PROCESS FOR DEPOSITING AN OXIDE EPITAXIALLY ONTO A SILICON SUBSTRATE AND STRUCTURES PREPARED WITH THE PROCESS"; and U.S. Pat. No. 5,482,003, issued Jan. 9, 1996, entitled "PROCESS FOR DEPOSITING EPITAXIAL ALKALINE EARTH OXIDE ONTO A SUBSTRATE AND STRUCTURES PREPARED WITH THE PROCESS." A strontium silicide ($SrSi_2$) interface model with a c(4×2) structure was proposed. See, e.g., R. McKee et al.,*Phys. Rev. Lett.* 81(14), 3014 (Oct. 5, 1998). Atomic level simulation of this proposed structure, however, indicates that it likely is not stable at elevated temperatures.

Growth of $SrTiO_3$ on silicon (100) using an SrO buffer layer has been accomplished. See, e.g., T. Tambo et al.,*Jpn. J. Appl. Phys.*, Vol. 37, p. 4454–4459 (1998). However, the SrO buffer layer was thick (100 Å), thereby limiting application for transistor films, and crystallinity was not maintained throughout the growth.

Furthermore, $SrTiO_3$ has been grown on silicon using thick oxide layers (60–120 Å) of SrO or TiO. See, e.g., B. K. Moon et al., *Jpn. J. Appl. Phys.*, Vol. 33, p. 1472–1477 (1994). These thick buffer layers, however, would limit the application for transistors.

In CMOS applications, these types of oxide layers are fabricated using molecular oxygen and are formed thin (i.e., less than 50 Å). Accordingly, a result is leaky films in which high electrical leakage is experienced due to oxygen deficiencies or vacancies. Furthermore, these films require a post-growth anneal in oxygen to reduce leakage current density across the oxide layer.

Accordingly, a need exists for a method for fabricating a high dielectric constant oxide on a semiconductor structure having low leakage current density.

It is a purpose of the present invention to provide for a method of fabricating a high dielectric constant oxide on a semiconductor structure having low leakage current density.

It is a further purpose of the present invention to provide for a method of fabricating a high dielectric constant oxide on a semiconductor structure in which the gate dielectric leakage current density is near zero.

It is another purpose of the present invention to provide for a method of fabricating a high dielectric constant semiconductor device structure using a high dielectric constant oxide such as $(A)_y(Ti_xM_{1-x})_{1-y}O_3$, wherein A is an alkaline earth metal or a combination of alkaline earth metals and M is a metallic or semi-metallic element.

BRIEF DESCRIPTION OF THE DRAWINGS

The present invention is illustrated by way of example and not limitation in the accompanying figures, in which like references indicate similar elements, and in which.

Figure 1:
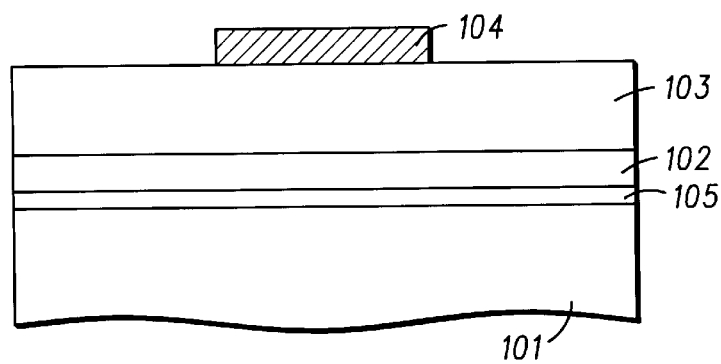
FIG. 1 illustrates schematically, in cross section, a semiconductor structure fabricated in accordance with one embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The present invention provides a method of fabricating a high dielectric constant oxide on a semiconductor structure using a high dielectric constant oxide such as $(A)_{y(Ti_xM_{1-x})1-y}O_3$, wherein A is an alkaline earth metal or a combination of alkaline earth metals and M is a metallic or semi-metallic element. The following example illustrates a process, in accordance with one embodiment of the invention, for fabricating such a semiconductor structure having a low leakage current density.

The process starts by providing a monocrystalline semiconductor substrate comprising, for example, silicon and/or germanium. In accordance with one embodiment of the invention, the semiconductor substrate is a silicon wafer having a (100) orientation. The substrate may be oriented on axis or, at most, about 0.5° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare," as used herein, is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer is first removed to expose the crystalline structure of the underlying substrate. The following process is generally carried out by molecular beam epitaxy (MBE), although other processes, such as those outlined below, may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature, a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value.

The process described above illustrates a process for forming a semiconductor structure including a silicon substrate and an overlying oxide layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like.

FIG. 1 illustrates schematically, in cross section, a structure 100 in accordance with an exemplary embodiment of the present invention. Structure 100 may be a device such as, for example, a component for a MOS device or any high dielectric constant device. Structure 100 includes a monocrystalline semiconductor substrate 101. Substrate 101 may comprise any suitable monocrystalline semiconductor material, such as, for example, silicon (Si), germanium (Ge), silicon germanium (Si—Ge), or gallium arsenide (GaAs). In one embodiment, substrate 101 comprises a monocrystalline silicon wafer. Substrate 101 may optionally include a plurality of material layers such that the composite substrate may be tailored to the quality, performance, and manufacturing requirements of a variety of semiconductor device applications.

A monocrystalline oxide transition layer 102 is optionally formed overlying substrate 101. Monocrystalline oxide transition layer 102, when present, may comprise a monocrystalline oxide material selected for its crystalline compatibility with the underlying substrate and with any overlying material layers. In an exemplary embodiment, layer 102 may comprise, for example, barium titanate ($BaTiO_3$), strontium titanate ($SrTiO_3$), or barium strontium titanate ($Sr_zBa_{1-z}TiO_3$, $0>z>1$). In one embodiment, layer 102 is a layer of $SrTiO_3$ having a thickness of about 1–10 monolayers. Prior to forming layer 102, a template layer 105 is formed overlying substrate 101. Template layer may include 1–10 monolayers of silicon, oxygen, and an element suitable to successfully grow layer 102. For example, if layer 102 is formed of $SrTiO_3$, a suitable template layer may be Si—O—Sr.

In the embodiment of the invention illustrated in FIG. 1, a monocrystalline oxide insulating layer 103 is formed overlying transition layer 102. If transition layer 102 is not present, insulating layer 103 may be formed overlying template layer 105. Layer 103 is formed by substitutionally incorporating an additional element into a monocrystalline oxide, such as an alkaline earth metal titanate, during formation of the layer. For example, during a molecular beam epitaxy growth process of $SrTiO_3$ or $BaTiO_3$ thin films on a silicon substrate, additional acceptor material sources can be The amount of additional material desired in the layer may be chosen such that the leakage current in the oxide film is minimized. Thus, the as grown oxide film will exhibit insulative properties and will not require further treatment in oxygen.

In an exemplary embodiment, layer 103 is formed by epitaxially growing by a process of molecular beam epitaxy a layer of $A_y(Ti_xM_{1-x})_{1-y}O_3$, where A is an alkaline earth metal, M is an additional element, such as aluminum (Al), silicon (Si), erbium (Er), lanthanum (La), gallium (Ga), or indium (In), and $0<x<1$, $0<y<1$. The concentration of the additional element in layer 103 may be chosen such that the leakage current in the monocrystalline oxide film is minimized, or otherwise selected in accordance with the quality, performance, and/or manufacturing requirements of the device. In an exemplary embodiment, the concentration of additional element incorporated into alkaline earth metal titanate layer 103 may range from greater than 0 to less than about 50 atomic percent of the titanium concentration (i.e., $0<x<0.5$). Various relative concentrations of alkaline earth metal, titanium, and additional elements in layer 103 may be achieved by establishing different flux rates for each of the materials during epitaxial growth of the alkaline earth metal titanate layer. Moreover, the thickness of layer 103 may vary widely according to the desired application of the semiconductor device, but is generally in the range of from about 5–100 nm.

In FIG. 1, insofar as layers 102 and 103 may comprise a gate dielectric for a high dielectric constant semiconductor device, a conductive gate electrode 104 may be formed overlying layer 103 in accordance with techniques well known to those skilled in the art. Electrode 104 may be formed of any suitable conductive material, such as, for example, platinum.

Figure 2:
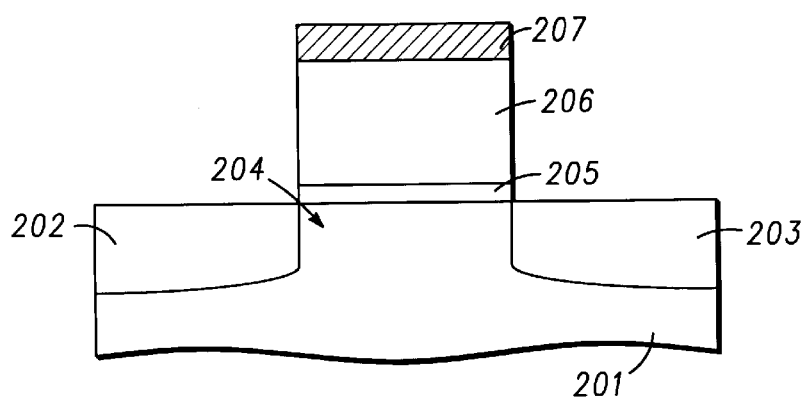
FIG. 2 illustrates schematically, in cross section, a semiconductor device structure fabricated in accordance with an alternative embodiment of the present invention.

FIG. 2 illustrates schematically, in cross section, a semiconductor device structure 200 fabricated in accordance with one alternative embodiment of the present invention, wherein semiconductor device structure 200 comprises a MOS device. Structure 200 includes a monocrystalline semiconductor substrate 201, such as a monocrystalline silicon wafer. Drain region 202 and source region 203 are formed in substrate 201 using techniques well known to those skilled in the art, such as, for example, selective n-type doping via ion implantation. In one aspect of this embodiment, regions 202 and 203 are N+ doped at a concentration of at least 1E19 atoms per cubic centimeter to enable ohmic contacts to be formed. A channel region 204 is defined by drain region 202 and source region 203 as the portion of substrate 201 between regions 202 and 203.

In one embodiment, a template layer 205 is formed overlying substrate 201 in channel region 204. Template layer 205 may include 1–10 monolayers of silicon, oxygen, and an element suitable to successfully grow layer 206. For example, if layer 206 is formed of $SrTiO_3$, a suitable template layer 205 may comprise Si—O—Sr.

A monocrystalline oxide insulating layer 206 is formed overlying template layer 205. As with layer 103 (FIG. 1), layer 206 is formed by substitutionally incorporating an additional element into an alkaline earth metal titanate during formation of the layer. Layer 206 is formed by epitaxially growing by a process of molecular beam epitaxy a layer of $A_y(T_xM_{1-x})_{1-y}O_3$ where A is an alkaline earth metal, M is an additional element, such as aluminum (Al), silicon (Si), erbium (Er), lanthanum (La), gallium (Ga), or indium (In), and $0<x<1$, $0<y<1$. In an exemplary embodiment, the concentration of additional element incorporated into alkaline earth metal titanate layer 206 may range from greater than 0 to less than about 50 atomic percent of the titanium concentration (i.e., $0<x<0.5$). Moreover, the thickness of layer 206 may vary widely according to the desired application of the semiconductor device, but is generally in the range of from about 5–100 nm.

In this embodiment, where device 200 is a MOS device, a conductive gate electrode 207 is formed overlying insulating layer 206 in accordance with techniques well known to those skilled in the art. Gate electrode 207 may be formed of any suitable conductive material, such as, for example, platinum.

Figure 3:
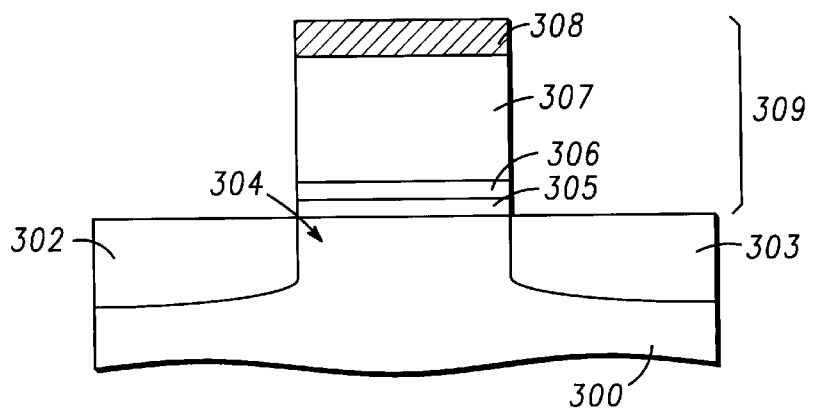
FIG. 3 illustrates schematically, in cross section, a MOS device structure in accordance with a further embodiment of the present invention.

FIG. 3 illustrates schematically, in cross section, a semiconductor device structure 300 fabricated in accordance with a further alternative embodiment of the present invention, wherein semiconductor device structure 300 comprises a MOS device. Structure 300 includes a monocrystalline semiconductor substrate 301, preferably a monocrystalline silicon wafer. Drain region 302 and source region 303 are formed in substrate 301 using techniques well known to those skilled in the art, such as, for example, selective n-type doping via ion implantation. In one aspect of this embodiment, regions 302 and 303 are N+ doped at a concentration of at least 1E19 atoms per cubic centimeter to enable ohmic contacts to be formed. A channel region 304 is defined by drain region 302 and source region 303 as the portion of substrate 301 between regions 302 and 303.

In this embodiment, a template layer 305 is formed overlying substrate 301 in channel region 304. Template layer 305 may be formed in accordance with the above description or in accordance with any other conventional techniques. For example, template layer 305 may include oxygen and an alkaline earth metal element suitable to successfully grow an overlying monocrystalline oxide layer, such as an alkaline earth metal titanate layer. In one aspect of an embodiment of the invention, template layer 305 is formed of 1–10 monolayers of Sr—O, Ba—O, or Sr—Ba—O.

A monocrystalline oxide transition layer 306 may be epitaxially grown overlying template layer 305 in channel region 304. Monocrystalline oxide transition layer 306, when present, may comprise, for example, barium titanate ($BaTiO_3$), strontium titanate ($SrTiO_3$), or barium strontium titanate ($Sr_zBa_{1-z}TiO_3$, $0>z>1$). In one embodiment, layer 306 is a layer of $SrTiO_3$ having a thickness of about 1–10 monolayers.

In the embodiment of the invention illustrated in FIG. 3, a monocrystalline oxide insulating layer 307 is formed overlying transition layer 306. If transition layer 306 is not present, insulating layer 307 may be formed overlying substrate 301 or template layer 305. As with layer 103 (FIG. 1), layer 307 is formed by substitutionally incorporating an additional element into an alkaline earth metal titanate during formation of the layer. Layer 307 is formed by epitaxially growing by a process of molecular beam epitaxy a layer of $A_y(Ti_xM_{1-x})_{1-y}O_3$, where A is an alkaline earth metal, M is an additional element, such as aluminum (Al), silicon (Si), erbium (Er), lanthanum (La), gallium (Ga), or indium (In), and $0<x<1$, $0<y<1$. In an exemplary embodiment, the concentration of additional element incorporated into alkaline earth metal titanate layer 307 may range from greater than 0 to less than about 50 atomic percent of the titanium concentration (i.e., $0<x<0.5$). Moreover, the thickness of layer 307 may vary widely according to the desired application of the semiconductor device, but is generally in the range of from about 5–100 nm.

In this embodiment, where device 300 is a MOS device, a conductive gate electrode 308 is formed overlying insulating layer 307 in accordance with techniques well known to those skilled in the art. Gate electrode 308 may be formed of any suitable conductive material, such as, for example, platinum.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive exclusive inclusion, such that a process, method, article, or apparatus that comprises a list of elements does not include only those elements but may include other elements not expressly listed or inherent to such process, method, article, or apparatus. Further, no element described herein is essential to the practice of the invention unless expressly described as "essential" or "required."

What is claimed is:

1. A high dielectric constant device structure comprising:
    a monocrystalline semiconductor substrate; and
    a monocrystalline insulating layer overlying the substrate, the insulating layer comprising $A_y(Ti_xM_{1-x})_{1-y}O_3$ where A is an alkaline earth metal, M is an element selected from the group consisting of Al, Si, Er, La, Ga, and In, and $0<x<1$, $0<y<1$.

2. The structure of claim 1 wherein the alkaline earth metal is selected from the group consisting of Ba, Sr, and combinations of Ba and Sr.

3. The structure of claim 1 further comprising a monocrystalline transition layer comprising an alkaline earth metal titanate underlying the monocrystalline insulating layer.

4. The structure of claim 3 wherein the monocrystalline transition layer comprises (Ba,Sr)TiO$_3$.

5. The structure of claim 3 wherein the monocrystalline transition layer has a thickness of less than about 1 nm.

6. The structure of claim 1 wherein the monocrystalline insulating layer has an equivalent silicon dioxide thickness of less than about 1.5 nm.

7. The structure of claim 1 further comprising a conductive electrode formed overlying the monocrystalline insulating layer.

8. The structure of claim 7 further comprising an electrically conductive region formed in the substrate.

9. The structure of claim 1 wherein the monocrystalline semiconductor substrate comprises a semiconductor material selected from the group consisting of Si, Ge, Si—Ge, and GaAs.

10. The structure of claim 1 wherein the monocrystalline semiconductor substrate comprises a layer of semiconductor material selected from the group consisting of InGaAs, InAlAs, AlGaAs, and InGaP.

11. The structure of claim 1 wherein x is less than 1 and greater than or equal to 0.5.

12. The structure of claim 1 further comprising a template layer overlying the monocrystalline semiconductor substrate.

13. The structure of claim 12 wherein the template layer comprises 1–10 monolayers comprising oxygen and an alkaline earth metal element.

14. A high dielectric constant device structure comprising:
a monocrystalline semiconductor substrate; and
a monocrystalline oxide layer epitaxially grown overlying the substrate, the monocrystalline oxide layer comprising an alkaline earth metal titanate incorporating an additional material to increase the bandgap of the monocrystalline oxide layer.

15. The device structure of claim 14 wherein the monocrystalline oxide layer comprises less than 50 atomic percent of the additional material relative to the titanium concentration.

16. The device structure of claim 14 wherein the alkaline earth metal titanate comprises (Ba,Sr)TiO$_3$ and the additional material comprises Al.

17. The device structure of claim 14 wherein the substrate comprises a semiconductor material selected from the group consisting of Si, Ge, Si—Ge, GaAs, AlGaAs, InAlAs, InGaAs, and InGaP.

18. The device structure of claim 14 further comprising a platinum electrode overlying the monocrystalline oxide layer.

19. The device structure of claim 14 wherein the monocrystalline oxide layer comprises less than 10 atomic percent of the additional material relative to the titanium concentration.

20. The device structure of claim 14 further comprising a monocrystalline transition layer underlying the monocrystalline oxide layer, the transition layer comprising an undoped alkaline earth metal titanate.

21. A high dielectric constant semiconductor device structure comprising:
a monocrystalline silicon substrate;
source, drain, and channel regions of a MOS transistor formed in the substrate;
a monocrystalline gate dielectric epitaxially formed overlying the channel region, the gate dielectric compromising (A)$_y$(Ti$_x$M$_{1-x}$)$_{1-y}$O$_3$ where A is an alkaline earth metal, M is an element selected from the group consisting of Al, Si, Er, La, Ga, and In, and x is less than 1 and greater than or equal to 0.5 and y is greater than zero and less than 1; and
a gate electrode overlying the gate dielectric.

22. The semiconductor device structure of claim 21 wherein the alkaline earth metal comprises an element selected from the group consisting of Ba, Sr, and Ba and Sr.

* * * * *